US012677527B2

(12) United States Patent
Sun et al.

(10) Patent No.: US 12,677,527 B2
(45) Date of Patent: Jul. 7, 2026

(54) LIGHT EMITTING DEVICE, MANUFACTURING METHOD OF THE LIGHT EMITTING DEVICE, AND DISPLAY DEVICE COMPRISING THE SAME

(71) Applicant: Samsung Display Co., LTD., Yongin-si (KR)

(72) Inventors: Jin-Won Sun, Seoul (KR); Sung Han Kim, Seongnam-si (KR); Chang Woong Chu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 618 days.

(21) Appl. No.: 17/874,752

(22) Filed: Jul. 27, 2022

(65) Prior Publication Data

US 2023/0180500 A1 Jun. 8, 2023

(30) Foreign Application Priority Data

Dec. 6, 2021 (KR) ........................ 10-2021-0173131

(51) Int. Cl.
*H10K 50/15* (2023.01)
*H10K 50/16* (2023.01)
*H10K 71/00* (2023.01)

(52) U.S. Cl.
CPC ............. *H10K 50/15* (2023.02); *H10K 50/16* (2023.02); *H10K 71/00* (2023.02)

(58) Field of Classification Search
CPC ......... H10K 50/14–167; H10K 71/621; H10K 71/20–236
See application file for complete search history.

(56) References Cited

U.S. PATENT DOCUMENTS

| | | | |
|---|---|---|---|
| 2008/0238310 A1 | 10/2008 | Forrest et al. | |
| 2009/0284128 A1* | 11/2009 | Shinohara | H10K 59/35 |
| | | | 313/498 |
| 2016/0155787 A1 | 6/2016 | Lee | |
| 2020/0075878 A1* | 3/2020 | Jiang | H10K 50/15 |
| 2021/0336174 A1* | 10/2021 | Jiang | H10K 71/40 |
| 2024/0389374 A1* | 11/2024 | Li | H10K 85/151 |

FOREIGN PATENT DOCUMENTS

| | | |
|---|---|---|
| CN | 103474586 A | 12/2013 |
| KR | 10-1029299 | 4/2011 |
| KR | 10-2012-0133961 | 12/2012 |
| KR | 10-1466833 | 11/2014 |
| KR | 20160066651 A | 6/2016 |

OTHER PUBLICATIONS

Won Hoe Koo et al., "Light extraction from organic light-emitting diodes enhanced by spontaneously formed buckles", Nature Photonics, Apr. 2010, pp. 222-226, vol. 4.

* cited by examiner

*Primary Examiner* — Julio J Maldonado
*Assistant Examiner* — Eric Manuel Mulero Flores
(74) *Attorney, Agent, or Firm* — Lerner David LLP

(57) ABSTRACT

A light-emitting device includes a first electrode; a second electrode that overlaps the first electrode in a plan view; an emission layer disposed between the first electrode and the second electrode; a hole transport region disposed between the first electrode and the emission layer; and an electron transport region disposed between the emission layer and the second electrode, and at least one of the hole transport region or the electron transport region includes a recess portion.

13 Claims, 7 Drawing Sheets

FIG. 6

LIGHT EMITTING DEVICE, MANUFACTURING METHOD OF THE LIGHT EMITTING DEVICE, AND DISPLAY DEVICE COMPRISING THE SAME

CROSS-REFERENCE TO RELATED APPLICATION(S)

This application claims priority to and benefits of Korean Patent Application No. 10-2021-0173131 under 35 U.S.C. § 119, filed in the Korean Intellectual Property Office on Dec. 6, 2021, the entire contents of which are incorporated herein by reference.

BACKGROUND

1. Technical Field

The disclosure relates to a light-emitting device, a manufacturing method of the light-emitting device, and a display device including the same.

2. Description of the Related Art

A light-emitting device is a device having a characteristic in which electrical energy is converted into light energy. Examples of such a light-emitting device include an organic light emitting element using an organic material for an emission layer, and a quantum dot light emitting device using quantum dots for an emission layer.

The light-emitting device may include a first electrode and a second electrode overlapping each other, a hole transport region positioned therebetween, an emission layer, and an electron transport region. Holes injected from the first electrode move to the emission layer through the hole transport region, and electrons injected from the second electrode move to the emission layer through the electron transport region. Holes and electrons combine to form excitons in an emission layer region. Light is generated as the excitons change from an excited state to a ground state.

The above information disclosed in this background section is only for enhancement of understanding of the background of the disclosure, and therefore, it may contain information that does not form the prior art that may already be known to a person of ordinary skill in the art.

SUMMARY

Embodiments have been made in an effort to provide a light-emitting device in which light extraction may be simplified, and that improves light-emitting efficiency and light-emitting lifespan. The embodiments have been made to provide a manufacturing method of a light-emitting device with a simple process and low required time and cost. The embodiments have also been made to provide a display device including a light-emitting device having improved light-emitting efficiency and light-emitting lifespan.

An embodiment may include a light-emitting device including a first electrode; a second electrode that overlaps the first electrode in a plan view; an emission layer disposed between the first electrode and the second electrode; a hole transport region disposed between the first electrode and the emission layer; and an electron transport region disposed between the emission layer and the second electrode, wherein at least one of the hole transport region and the electron transport region may include a recess portion.

The hole transport region may include a first recess portion, and the first recess portion may be disposed on a surface of the hole transport region facing the emission layer.

The hole transport region may include first recess portions, and the first recess portions may be randomly disposed.

The first recess portions may have different sizes and shapes.

The electron transport region may include a second recess portion, and the second recess portion may be disposed on a side of the hole transport region facing the second electrode.

The electron transport region may include second recess portions, and the second recess portions may be randomly disposed.

The second recess portions may include different sizes and shapes.

An embodiment may include a manufacturing method of a light-emitting device, including forming a hole transport region on a first electrode; and forming an emission layer, an electron transport region, and a second electrode on the hole transport region, sequentially, wherein the forming of the hole transport region may include forming a recess portion in the hole transport region by a pressurized film.

The pressurized film may include a first layer including carbon black; and a second layer including nanoparticles and disposed on the first layer.

The forming of the hole transport region may include applying light to the pressurized film after bringing the second layer into contact with the hole transport region.

The carbon black may convert the light into thermal energy that allows the nanoparticles to press the hole transport region.

The hole transport region may be formed by removing the pressurized film.

The recess portion may be formed on a surface of the hole transport region facing the emission layer.

An embodiment may include a manufacturing method of a light-emitting device, including forming a hole transport region and an emission layer on a first electrode, sequentially; forming the electron transport region on the emission layer; and forming a second electrode on the electron transport region, wherein the forming of the electron transport region may include forming a recess portion in the hole transport region by a pressurized film.

The pressurized film may include a first layer including carbon black; and a second layer including nanoparticles and disposed on the first layer.

The forming of the electron transport region may include applying light to the pressurized film after bringing the second layer into contact with the electron transport region.

The carbon black may convert the light into thermal energy that allows the nanoparticles to press the electron transport region.

The electron transport region may be formed by removing the pressurized film.

The recess portion may be formed on a surface of the electron transport region facing the second electrode.

The display device according to an embodiment may include the above-described light emitting device.

According to the embodiments, it is possible to provide a light-emitting device in which light extraction may be simplified, and that improves light-emitting efficiency and light-emitting lifespan. According to the embodiments, it is possible to provide a manufacturing method of a light-emitting device with a simple process and low required time and cost. According to the embodiments, it is possible to provide a display device including a light-emitting device having improved light-emitting efficiency and light-emitting lifespan.

BRIEF DESCRIPTION OF THE DRAWINGS

The above and other aspects and features of the disclosure will become more apparent by describing in detail embodiments thereof with reference to the attached drawings, in which:

FIG. 5, FIG. 6, and FIG. 7 each illustrate a schematic cross-sectional view showing a manufacturing method of a light-emitting device according to an embodiment.

DETAILED DESCRIPTION OF THE EMBODIMENTS

Figure 1:
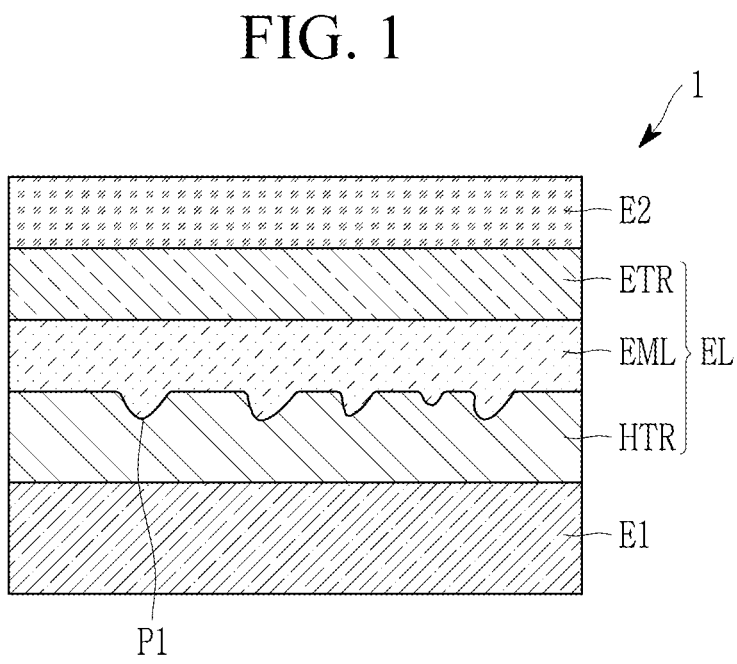
FIG. 1 illustrates a schematic cross-sectional view of a light-emitting device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

To clearly describe the disclosure, parts that may be irrelevant to the description may be omitted, and like numerals refer to like or similar constituent elements throughout the specification.

Further, since sizes and thicknesses of constituent members shown in the accompanying drawings may be arbitrarily given for better understanding and ease of description, the disclosure is not limited to the illustrated sizes and thicknesses. In the drawings, the thicknesses of layers, films, panels, regions, etc., may be exaggerated for clarity. In the drawings, for better understanding and ease of description, the thicknesses of some layers and areas may be exaggerated.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, in the specification, the phrase "in a plan view" means when an object portion is viewed from above, and the phrase "in a cross-sectional view" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within $\pm 30\%$, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the specification, "(intermediate layer) includes a compound represented by Chemical Formula 1" may be interpreted as "(intermediate layer) may include one compound belonging to the category of Chemical Formula 1 or two or more different compounds belonging to the category of Chemical Formula 1."

In this specification, "Group" indicates a group on the IUPAC periodic table of elements.

In this specification, "alkali metal" indicates a Group 1 element. For example, the alkali metal may be lithium (Li), sodium (Na), potassium (K), rubidium (Rb), or cesium (Cs).

In this specification, "alkaline earth metal" indicates a Group 2 element. For example, the alkaline earth metal may be magnesium (Mg), calcium (Ca), strontium (Sr), or barium (Ba).

In the specification, "lanthanum metal" indicates lanthanum and a lanthanum group element in the periodic table. For example, a metal of the lanthanum group may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or ruthenium (Ru).

In this specification, "transition metal" refers to elements belonging to Groups 3 to 12 while belonging to cycle 4 to cycle 7. For example, the transition metal may be titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), or cadmium (Cd).

In this specification, "post-transition metal" refers to elements belonging to Groups 13 to 17 while belonging to cycle 4 to cycle 7. For example, the post-transition metal may be aluminum (Al), gallium (Ga), indium (In), thallium (Tl), tin (Sn), lead (Pb), bismuth (Bi), or polonium (Po).

In this specification, "halogen" indicates a Group 17 element. For example, the halogen may be fluorine (F), chlorine (Cl), bromine (Br), or iodine (I).

In the specification, the term "inorganic semiconductor compound" refers to any compound that is an inorganic material and has a band gap of less than 4 eV. For example, the inorganic semiconductor compounds may include a lanthanide metal halide, a transition metal halide, a post-transition metal halide, tellurium, a lanthanide metal telluride, a transition metal telluride, a post-transition metal telluride, a selenide of a lanthanide group metal, a selenide of a transition metal, a selenide of a post-transition metal, or any combination thereof. More for example, the inorganic semiconductor compound may include $EuI_2$, $YbI_2$, $SmI_2$, $TmI_2$, AgI, CuI, $NiI_2$, $CoI_2$, $BiI_3$, $PbI_2$, $SnI_2$, Te, EuTe, YbTe, SmTe, TmTe, EuSe, YbSe, SmSe, TmSe, ZnTe, CoTe, ZnSe, CoSe, $Bi_2Te_3$, $Bi_2Se_3$, or any combination thereof.

In the specification, "inorganic insulator compound" refers to all compounds that are inorganic and have a band gap of 4 eV or more. For example, the inorganic insulator compound may include a halide of an alkali metal, a halide of an alkaline earth metal, a halide of a lanthanide metal, or any combination thereof. By way of further example, the inorganic insulator compound may include NaI, KI, RbI, CsI, NaCl, KCl, RbCl, CsCl, NaF, KF, RbF, CsF, $MgI_2$, $CaI_2$, $SrI_2$, $BaI_2$, $MgCl_2$, $CaCl_2$, $SrCl_2$, $BaCl_2$, $MgF_2$, $CaF_2$, $SrF_2$, $BaF_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

In the specification, "halide of an alkali metal" refers to a compound in which an alkali metal and a halogen are ionically bonded. For example, the halide of the alkali metal may include NaI, KI, RbI, CsI, NaCl, KCl, RbCl, CsCl, NaF, KF, RbF, CsF, or any combination thereof.

In this specification, "halide of an alkaline earth metal" refers to a compound in which an alkaline earth metal and a halogen are ionically bonded. For example, the halide of the alkaline earth metal may include $MgI_2$, $CaI_2$, $SrI_2$, $BaI_2$, $MgCl_2$, $CaCl_2$, $SrCl_2$, $BaCl_2$, $MgF_2$, $CaF_2$, $SrF_2$, $BaF_2$, or any combination thereof.

In the specification, "halide of a lanthanum group metal" refers to a compound in which a lanthanum group metal and a halogen are ionically and/or covalently bonded. For example, the halide of the lanthanide metal may include $EuI_2$, $YbI_2$, $SmI_2$, $TmI_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

In the specification, "halide of a transition metal" refers to a compound in which a transition metal and a halogen are ionically and/or covalently bonded. For example, the halide of the transition metal may include AgI, CuI, $NiI_2$, $CoI_2$, or any combination thereof.

In the specification, "halide of a post-transition metal" refers to a compound in which a post-transition metal and a halogen are ionically and/or covalently bonded. For example, the halide of the post-transition metal may include $BiI_3$, $PbI_2$, $SnI_2$, or any combination thereof.

In the specification, "telluride of a lanthanum group metal" refers to a compound in which a lanthanum group metal and tellurium (Te) are ionically, covalently, and/or metallically bonded. For example, the telluride of the lanthanum metal may include EuTe, YbTe, SmTe, TmTe, or any combination thereof.

In the specification, "transition metal telluride" refers to a compound in which a transition metal and tellurium are ionically, covalently, and/or metallically bonded. For example, the telluride of the transition metal may include ZnTe, CoTe, or any combination thereof.

In the specification, "post-transition metal telluride" refers to a compound in which a post-transition metal and tellurium are ionically, covalently, and/or metallically bonded. For example, the post-transition metal telluride may include $Bi_2Te_3$.

In the specification, "selenide of a lanthanide metal" refers to a compound in which a lanthanum metal and selenium (Se) are ionically, covalently, and/or metallically bonded. For example, the selenide of the lanthanum metal may include EuSe, YbSe, SmSe, TmSe, or any combination thereof.

In the specification, "selenide of a transition metal" refers to a compound in which a transition metal and selenium are ionically, covalently, and/or metallically bonded. For example, the selenide of the transition metal may include ZnSe, CoSe, or any combination thereof.

In the specification, "selenide of a post-transition metal" refers to a compound in which a post-transition metal and selenium are ionically, covalently, and/or metallically bonded. For example, the selenide of the post-transition metal may include $Bi_2Se_3$.

Figure 2:
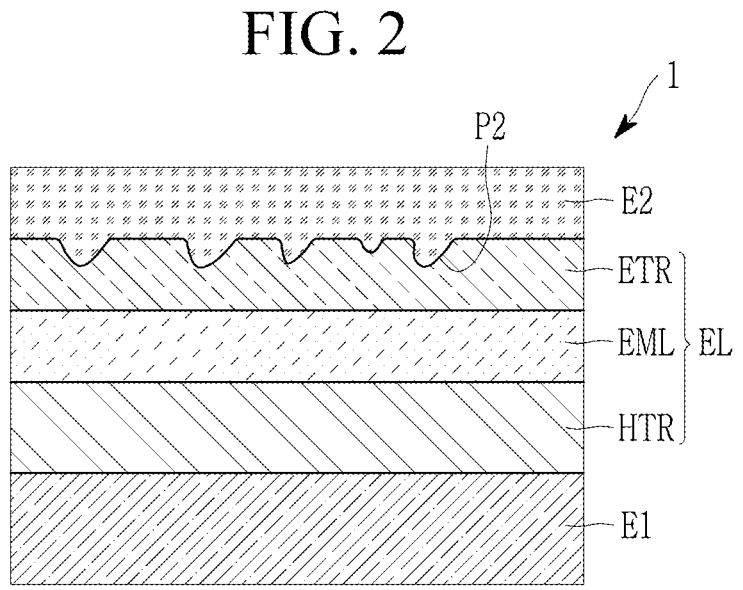
FIG. 2 illustrates a schematic cross-sectional view of a light-emitting device according to an embodiment.

Hereinafter, a light-emitting device according to an embodiment will be described with reference to FIG. 1 and FIG. 2. FIG. 1 illustrates a schematic cross-sectional view of a light-emitting device according to an embodiment, and FIG. 2 illustrates a schematic cross-sectional view of a light-emitting device according to an embodiment.

First of all, referring to FIG. 1, the light-emitting device 1 may include a first electrode E1, a second electrode E2, and an emission unit EL positioned (or disposed) between the first electrode E1 and the second electrode E2.

The light-emitting device 1 according to an embodiment of the disclosure may be a top emission type. The first electrode E1 may be an anode, and the second electrode E2 may be a cathode. The light-emitting device 1 according to an embodiment may be a bottom emission type. The first electrode E1 may be a cathode, and the second electrode E2 may be an anode. In the light-emitting device 1 according to an embodiment, the first electrode E1 is a reflective electrode, and the second electrode E2 is a transmissive or transflective electrode, and the light-emitting device 1 may emit light in a direction from the first electrode E1 to the second electrode E2. Hereinafter, a case in which the light-emitting device is the top emission type will be described.

The first electrode E1 may be formed by, for example, providing a material for the first electrode at an upper portion of a substrate by using a deposition method, a sputtering method, or the like, within the spirit and the scope of the disclosure. In case that the first electrode E1 is an anode, the material for the first electrode may be selected from among materials having a high work function to facilitate hole injection.

The first electrode E1 may be a reflective electrode, a transflective electrode, or a transmissive electrode. The material for the first electrode may be selected from among an indium tin oxide (ITO), an indium zinc oxide (IZO), a tin oxide (SnO$_2$), a zinc oxide (ZnO), and any combination thereof in order to form the first electrode E1 which is a transmissive electrode, but the disclosure is not limited thereto. By way of example, the material for the first electrode may be selected from among magnesium (Mg), silver (Ag), aluminum (Al), aluminum-lithium (Al—Li), calcium (Ca), magnesium-indium (Mg—In), magnesium-silver (Mg—Ag), and any combination thereof in order to form the first electrode E1, which is a transflective electrode or a reflective electrode, but the disclosure is not limited thereto.

The first electrode E1 may have a single-layer structure that is a single layer or a multi-layered structure having layers. For example, the first electrode E1 may have a three-layer structure of ITO/Ag/ITO, but the disclosure is not limited thereto.

The emission unit EL is positioned on the first electrode E1. Although the specification shows an embodiment including one emission unit EL, the disclosure is not limited thereto, and the light emitting device 1 according to an embodiment may include at least one emission unit EL.

The emission unit EL may include an emission layer EML. The emission unit EL may include at least one of a hole transport region HTR or an electron transport region ETR. The hole transport region HTR may include a hole injection layer, a hole transport layer, an electron blocking layer, or any combination thereof. The electron transport region ETR may include a hole blocking layer, an electron transport layer, an electron injection layer, or any combination thereof.

The hole transport region HTR may be formed using a general method, for example. For example, the hole transport region HTR may be formed by using a variety of methods such as vacuum deposition, spin coating, casting, a Langmuir-Blodgett (LB) technique, inkjet printing, laser printing, and laser induced thermal imaging (LITI).

The hole transport region (HTR) according to an embodiment may include a first recess portion P1 formed on a first surface (or surface) thereof. The hole transport region HTR may include a first recess portion P1 formed on a first surface thereof facing the emission layer EML. The first recess portion P1 may have a depth of about 10 Å or more. This specification describes an embodiment in which the hole transport region HTR may include the first recess portion P1, and according to an embodiment, in the hole transport region HTR, the hole injection layer may include the first recess portion P1, the hole transport layer may include the first recess portion P1, or the electron blocking layer may include the first recess portion P1, or any combination thereof.

The first recess portion P1 according to an embodiment may be randomly positioned on a first surface of the hole transport region HTR. The first recess portion P1 may be irregularly distributed in the hole transport region HTR. According to an embodiment, a size of the first recess portion P1, a distance between first recess portions P1, a distance between centers of the first recess portions P1, and a number of the first recess portions P1 formed on the hole transport region HTR may be different. The first recess portion P1 may be formed through various processes, and a manufacturing process of the first recess portion P1 according to an embodiment will be described later with reference to FIG. 5 to FIG. 7.

The hole transport region HTR according to an embodiment may include a fine pattern in the shape of the recess portion P1 to increase extraction efficiency of light generated from the light-emitting device. For example, efficiency of light emitted to the outside may be improved due to scattering of light by the recess portion P1. The first recess portion P1 included in the hole transport region HTR may serve as a scatterer for light emitted from the light-emitting device.

In case that the first recess portion P1 is randomly positioned on the hole transport region HTR, some of the light emitted from the light-emitting device may be emitted from the first recess portion P1 by total reflection or a waveguide mode. For example, efficiency and lifespan of light emitted from the light-emitting device may be improved.

The hole injection layer included in the hole transport region HTR may include a hole injection material. The hole injection material may include a phthalocyanine compound such as copper phthalocyanine; DNTPD (N,N'-diphenyl-N, N'-bis-[4-(phenyl-m-tolyl-amino)-phenyl]-biphenyl-4,4'-di-amine), m-MTDATA (4,4',4"-[tris(3-methylphenyl)phe-nylamino]triphenyl amine), TDATA (4,4',4"-tris(N,N-diphenylamino)triphenylamine), 2-TNATA (4,4',4"-tris{N-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/camphor sulfonicacid), PANI/PSS (polyaniline/poly(4-styrenesulfonate)), NPB (N,N'-di(naphthalene-l-yl)-N,N'-diphenyl-benzidine), NPD (N,N'-Di(1-naphthyl)-N,N'-diphenyl-(1,1'-biphenyl)-4,4'-diamine), polyether ketone containing triphenylamine (TPAPEK), 4-Isopropyl-4'-meth-yldiphenyliodonium [tetrakis(pentafluorophenyl)borate], HAT-CN (dipyrazino[2,3-f:2',3'-h] quinoxaline-2,3,6,7,10, 11-hexacarbonitrile), and the like, within the spirit and the scope of the disclosure.

The hole transport layer included in the hole transport region may include a hole transport material. The hole transport material may include a carbazole-based derivative such as N-phenylcarbazole and polyvinylcarbazole, a fluorene-based derivative, TPD (N,N'-bis(3-methylphenyl)-N, N'-diphenyl-[triphenylamine derivatives such as 1,1-biphenyl]-4,4'-diamine), TCTA (4,4',4''-tris(N-carbazolyl) triphenylamine), NPB (N,N'-di(naphthalene-l-yl)-N,N'-diphenyl-benzidine), TAPC (4,4'-cyclohexylidene bis[N,N-bis(4-methylphenyl)benzenamine]), HMTPD (4,4'-bis[N, N'-(3-tolyl)amino]-3,3'-dimethylbiphenyl), mCP (1,3-bis(N-carbazolyl)benzene), CzSi (9-(4-tert-butylphenyl)-3,6-bis (triphenylsilyl)-9H-carbazole), m-MTDATA (4,4',4''-[tris(3-methylphenyl)phenylamino]triphenylamine), and the like, within the spirit and the scope of the disclosure.

A thickness of the hole transport region HTR may be in a range of about 100 Å to about 10000 Å, for example, in a range of about 100 Å to about 5000 Å. For example, the thickness of the hole injection layer may be in a range of about 30 Å to about 1000 Å, and the thickness of the hole transport layer may be in a range of about 30 Å to about 1000 Å. In case that thicknesses of the hole transport region HTR, the hole injection layer, and the hole transport layer satisfy the above-described ranges, a satisfactory hole transport characteristic may be obtained without a substantial increase in driving voltage.

The electron blocking layer is a layer that prevents electrons from leaking from the electron transport region ETR to the hole transport region HTR. A thickness of the electron blocking layer may be in a range of about 10 Å to about 1000 Å. The electron blocking layer may include, for example, a carbazole-based derivative such as N-phenylcarbazole or polyvinylcarbazole, a fluorene-based derivative, or TPD (N,N'-bis(3-methylphenyl)-N,N'-diphenyl-triphenylamine derivatives such as [1,1-biphenyl]-4,4'-diamine), TCTA (4,4',4''-tris(N-carbazolyl)triphenyl amine), NPD (N,N'-di(naphthalene-l-yl)-N,N'-diphenyl-benzidine), TAPC (4,4Çidene bis[N,N-bis(4-methylphenyl)benzenamine]), HMTPD (4,4'-bis[N,N'-(3-tolyl)amino]-3,3'-dimethylbiphenyl), mCP, or the like, within the spirit and the scope of the disclosure.

The hole transport region HTR may further include a charge generating material to improve conductivity in addition to the above-mentioned materials. The charge generating material may be uniformly or non-uniformly dispersed in the hole transport region HTR. The charge generating material may be, for example, a p-dopant. The p-dopant may be one of a quinone derivative, a metal oxide, and a compound containing a cyano group, but the disclosure is not limited thereto. For example, non-limiting examples of the p-dopant may include quinone derivatives such as TCNQ (tetracyanoquinodimethane) and F4-TCNQ (2,3,5,6-tetrafluoro-7,7',8,8'-tetracyanoquinodimethane), and metal oxides such as tungsten oxide and molybdenum oxide, but the disclosure is not limited thereto.

Each layer of the electron transport region ETR may be formed using a general method, for example. For example, the electron transport region ETR may be formed by using a variety of methods such as vacuum deposition, spin coating, casting, a Langmuir-Blodgett (LB) technique, inkjet printing, laser printing, and laser induced thermal imaging (LITI).

The electron injection layer included in the electron transport region ETR may include an electron injection material. As the electron injection material, a metal halide such as LiF, NaCl, CsF, RbCl, or RbI, a lanthanide metal such as Yb or $Li_2O$, a metal oxide such as BaO, or lithium quinolate (LiQ) may be used, but the disclosure is not limited thereto. The electron injection layer may also be made of a material in which an electron transport material and an insulating organo metal salt are mixed. The organo metal salt may be a material having an energy band gap of about 4 eV or more. For example, for example, the organo metal salt may include metal acetate, metal benzoate, metal acetoacetate, metal acetylacetonate, or metal stearate.

The electron transport layer included in the electron transport region ETR may include an electron transport material. The electron transport material may include a triazine-based compound or an anthracene-based compound. However, the disclosure is not limited thereto, and the electron transport material may include, for example, $Alq_3$ (Tris(8-hydroxyquinolinato)aluminum), 1,3,5-tri[(3-pyridyl)-phen-3-yl]benzene, 2,4,6-tris(3'-(pyridin-3-yl)bi-phenyl-3-yl)-1,3,5-triazine, 2-(4-(N-phenylbenzoimida-zolyl-1-ylphenyl)-9,10-dinaphthylanthracene, TPBi (1,3,5-tris(1-phenyl-1H-benzo[d]imidazol-2-yl)benzene), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), $Bebq_2$ (berylliumbis (benzoquinolin-10-olate), ADN (9,10-di(naphthalene-2-yl) anthracene), TSPO1 (diphenyl (4-(triphenylsilyl)phenyl) phosphine oxide), TPM-TAZ (2,4,6-tris(3-(pyrimidin-5-yl) phenyl)-1,3,5-triazine), and a mixture thereof.

Each of the electron injection layers may have a thickness in a range of about 1 Å to about 500 Å, or in a range of about 3 Å to about 300 Å. In case that the thickness of the electron injection layer satisfies the range as described above, a satisfactory electron injection characteristic may be obtained without a substantial increase in driving voltage.

Each of the electron transport layers may have a thickness in a range of about 100 Å to about 1000 Å, for example, in a range of about 150 Å to about 500 Å. In case that the thickness of the electron transport layer satisfies the range as described above, a satisfactory electron transport characteristic may be obtained without a substantial increase in driving voltage.

The hole blocking layer is a layer serving to prevent leakage of holes from the hole transport region HTR to the electron transport region ETR. A thickness of the hole blocking layer may be in a range of about 10 Å to about 1000 Å.

The hole blocking layer may include at least one of, for example, BCP (2,9-dimethyl-4,7-diphenyl-1,10-phenanthroline), Bphen (4,7-diphenyl-1,10-phenanthroline), or T2T (2,4,6-tri([1,1'-biphenyl]-3-yl)-1,3,5-triazine), but the disclosure is not limited thereto.

The emission layer EML may be disposed on the hole transport region HTR. For example, the emission layer EML may be disposed on the first recess portion P1 of the hole transport region HTR. The emission layer EML may be disposed on the hole transport region HTR while filling the first recess portion P1. An upper surface of the emission layer EML may be flat, and a lower surface of the emission layer EML may have a convex shape corresponding to the first recess portion P1. Although the specification has illustrated and described a shape in which the upper surface of the emission layer EML is flat, the disclosure is not limited thereto, and at least a portion of the upper surface of the emission layer EML may not be flat in correspondence to the first recess portion P1.

The emission layer EML may include at least one selected from an organic compound and a semiconductor compound, but the disclosure is not limited thereto. The organic compound may contain a host and a dopant. The semiconductor compound may be a quantum dot, for example, the light-emitting device may be a quantum dot light-emitting device. By way of example, the semiconductor compound may be an organic and/or inorganic perovskite.

A thickness of the emission layer EML may be in a range of about 0.1 nm to about 100 nm. For example, the thickness of the emission layer EML may be in a range of about 15 nm to about 50 nm. As a further example, in case that the emission layer EML emits blue light, a thickness of the blue emission layer may be in a range of about 15 nm to about 20 nm, in case that the emission layer emits green light, a thickness of the green emission layer may be in a range of about 20 nm to about 40 nm, and in case that the emission layer emits red light, a thickness of the red emission layer may be in a range of about 40 nm to about 50 nm. In case that the above-described range is satisfied, the light-emitting device may exhibit an excellent light emitting characteristic without a substantial increase in driving voltage.

The emission layer EML may include a host material and a dopant material. The emission layer EML may be formed by using a phosphorescent or fluorescent emission material as a dopant in the host material. The emission layer EML may be formed by including a thermally activated delayed fluorescence (TADF) dopant in the host material. By way of example, the emission layer EML may include a quantum dot material as an emission material. A core of the quantum dot may be selected from among a group II-VI compound, a group III-V compound, a group IV-VI compound, a group IV element, a group IV compound, and a combination thereof.

The color of light emitted from the emission layer EML may be determined by a combination of a host material and a dopant material, or a type of a quantum dot material and a size of a core.

As the host material of the emission layer EML, a material may be used and is not particularly limited, but may be selected from among a fluoranthene derivative, a pyrene derivative, an arylacetylene derivative, an anthracene derivative, a fluorene derivative, a perylene derivative, a chrysene derivative, and the like, within the spirit and the scope of the disclosure. By way of example, the pyrene derivative, the perylene derivative, and the anthracene derivative may be selected.

As the dopant material of the emission layer EML, a material may be used, and although not particularly limited, a styryl derivative (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), perylene and its derivatives (for example, 2,5,8,11-tetra-t-butylperylene (TBP)), pyrene and its derivatives (for example, 1,1-dipyrene, 1,4-dipyrenylbenzene, 1,4-bis(N, N-diphenylamino)pyrene), N1,N6-di(naphthalen-2-yl)-N1,N6-diphenylpyrene-1,6-diamine), and the like, within the spirit and the scope of the disclosure.

Hereinafter, a light-emitting device according to an embodiment will be described with reference to FIG. 2. A description of a same configuration as that of the light-emitting device described in FIG. 1 will be omitted.

The electron transport region ETR according to an embodiment may include a second recess portion P2 formed on a first surface thereof. The electron transport region ETR may include the second recess portion P2 formed on a first surface thereof facing the second electrode E2. The second recess portion P2 may have a depth of about 10 Å or more. This specification describes an embodiment in which the electron transport region ETR may include the second recess portion P2, and according to an embodiment, in the electron transport region ETR, the electron injection layer may include the second recess portion P2, the electron transport layer may include the second recess portion P2, or the electron blocking layer may include the second recess portion P2, or any combination thereof.

The second recess portion P2 according to an embodiment may be randomly positioned on a first surface of the electron transport region ETR. The second recess portion P2 may be irregularly distributed in the electron transport region ETR. According to an embodiment, a size of the second recess portion P2, a distance between second recess portions P2, a distance between centers of the second recess portions P2, and a number of the second recess portions P2 formed on the electron transport region ETR may be different. The second recess portion P2 may be formed through various processes, and a manufacturing process of the second recess portion P2 according to an embodiment will be described later with reference to FIG. 5 to FIG. 7.

The electron transport region ETR according to an embodiment may include a fine pattern in the shape of the second recess portion P2 to increase extraction efficiency of light generated from the light-emitting device. For example, efficiency of light emitted to the outside may be improved due to scattering of light by the second recess portion P2. The second recess portion P2 included in the electron transport region ETR may serve as a scatterer for light emitted from the light-emitting device.

In case that the second recess portion P2 is randomly positioned on the electron transport region ETR, some of the light emitted from the light-emitting device may be emitted from the second recess portion P2 by total reflection or a waveguide mode. For example, efficiency and lifespan of light emitted from the light-emitting device may be improved.

The second electrode E2 may be positioned on the electron transport region ETR. For example, the second electrode E2 may be positioned on the second recess portion P2 of the electron transport region ETR. The second electrode E2 may be positioned on the electron transport region ETR while filling the second recess portion P2. An upper surface of the second electrode E2 may be flat, and a lower surface of the second electrode E2 may have a convex shape corresponding to the second recess portion P2. Although the specification has illustrated and described a shape in which the upper surface of the second electrode E2 is flat, the disclosure is not limited thereto, and at least a portion of the upper surface of the second electrode E2 may not be flat in correspondence to the second recess portion P2.

Figure 3:
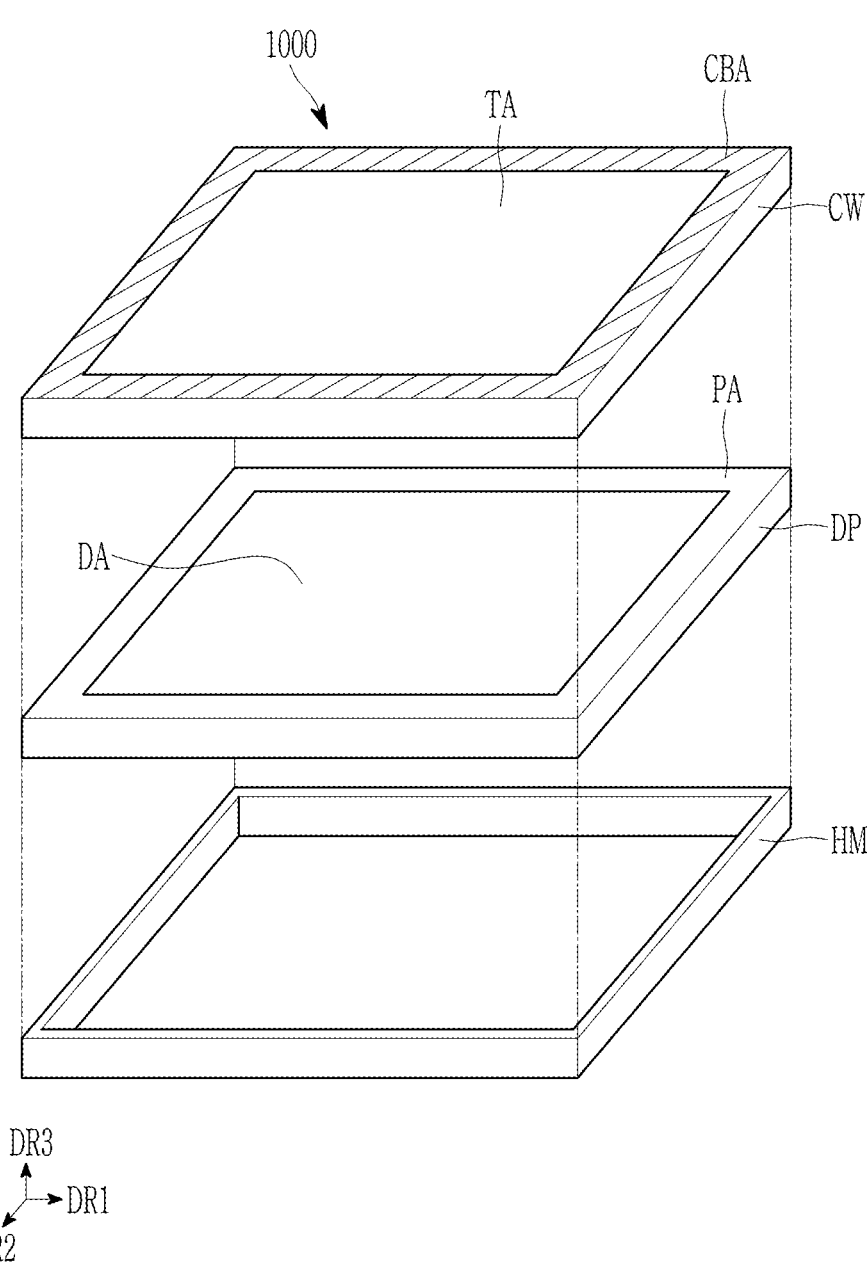
FIG. 3 illustrates a schematic exploded perspective view of a display device according to an embodiment.
Figure 4:
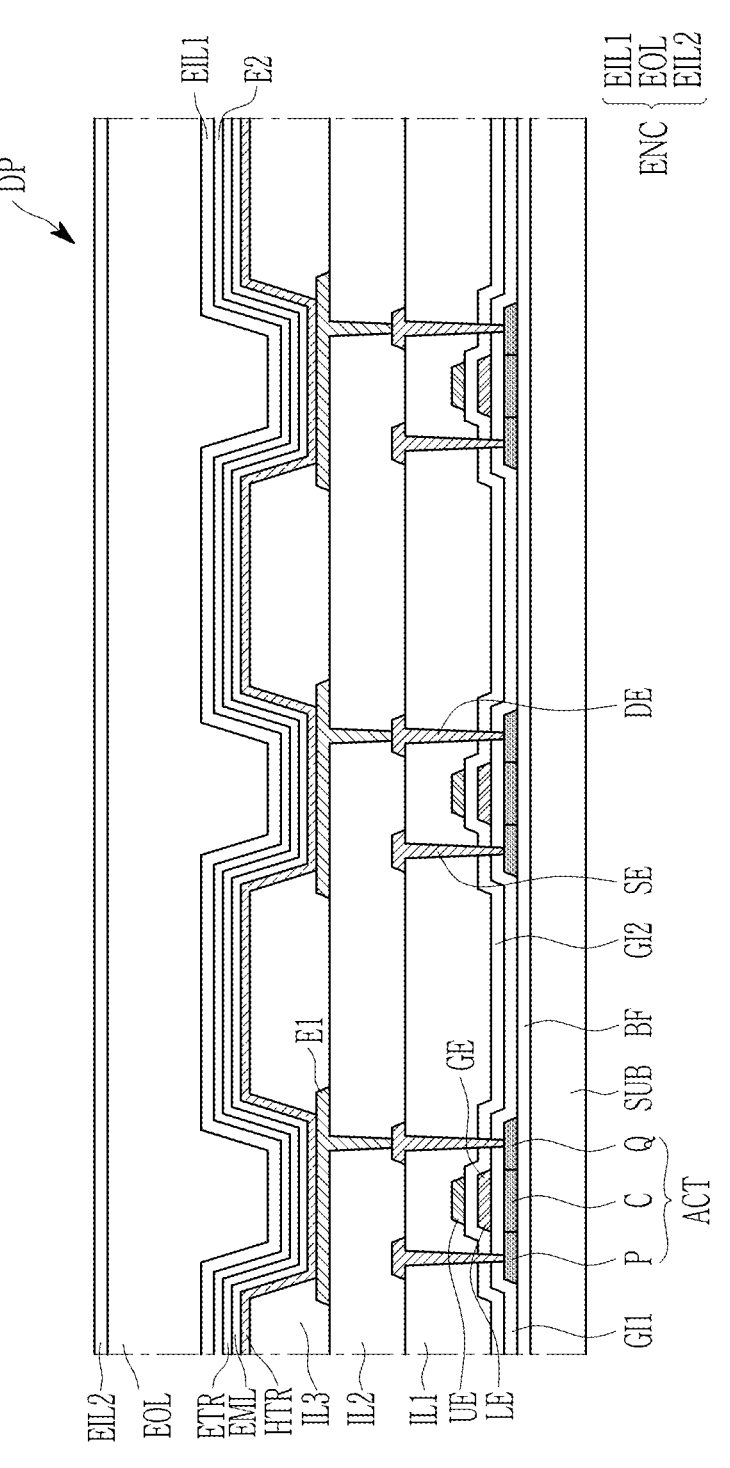
FIG. 4 illustrates a schematic cross-sectional view of a display panel according to an embodiment.

Hereinafter, a display device according to an embodiment will be described with reference to FIG. 3 and FIG. 4. FIG. 3 illustrates a schematic exploded perspective view of a display device according to an embodiment, and FIG. 4 illustrates a schematic cross-sectional view of a display panel according to an embodiment.

Referring to FIG. 3, a display device according to an embodiment may include a cover window CW, a display panel DP, and a housing HM.

The cover window CW may include an insulating panel. For example, the cover window CW may be formed of glass, plastic, or a combination thereof.

A front surface of the cover window CW may define a front surface of the display device 1000. A transmissive area TA may be an optically transparent area. For example, the transmissive area TA may be an area having visible ray transmittance of about 90% or more.

A blocking area CBA defines a shape of the transmissive area TA. The blocking area CBA may be adjacent to the transmissive area TA, to surround the transmissive area TA. The blocking area CBA may be an area having relatively low light transmittance compared to the transmissive area TA. The blocking area CBA may include an opaque material that blocks light. The blocking area CBA may have a color. The blocking area CBA may be defined by a bezel layer provided separately from a transparent substrate defining the transmissive area TA, or may be defined by an ink layer formed by being inserted or colored in a transparent substrate.

In the display panel DP, a first surface on which an image is displayed is parallel to a surface defined by a first direction DR1 and a second direction DR2. A direction normal to a surface on which an image is displayed, for example, a thickness direction of the display panel DP, is represented as a third direction DR3. A front (or top) surface and a back (or bottom) surface of each of the members are separated in the third direction DR3. However, the directions indicated by the first to third directions DR1, DR2, and DR3 may be converted to other directions as a relative concept.

The display panel DP may be a flat rigid display panel, but the disclosure is not limited thereto, and may also be a flexible display panel. The display panel DP may be formed as an organic light emitting panel. However, a type of the display panel DP is not limited thereto, and it may be formed as various types of panels. For example, the display panel DP may be formed as a liquid crystal display panel, an electrophoretic display panel, an electrowetting display panel, or the like, within the spirit and the scope of the disclosure. The display panel DP may be formed as a next-generation display panel such as a micro light emitting diode display panel, a quantum dot light emitting diode display panel, or a quantum dot organic light emitting diode display panel.

The micro LED display panel is formed in such a way that a light emitting diode having a size in a range of about 10 to about 100 μm constitute each pixel. Such a micro light emitting diode display panel may use an inorganic material, may omit a backlight, may have a fast reaction speed, may implement high luminance with low power, and may not be broken in case that bent. A quantum dot light emitting diode display panel is formed by attaching a film containing quantum dots or using a material containing quantum dots. Quantum dots refer to particles made of an inorganic material such as indium or cadmium, emitting light by themselves, and having a diameter of several nanometers or less. Light of a desired color may be displayed by controlling a particle size of the quantum dots. The quantum dot organic light emitting diode display panel is formed by a method of realizing color by using a blue organic light emitting diode as a light source and attaching a film containing red and green quantum dots thereon, or depositing a material containing red and green quantum dots. The display panel DP according to an embodiment may be formed as various other display panels.

As illustrated FIG. 3, the display panel DP may include a display area DA in which an image is displayed, and a non-display area PA adjacent to the display area DA. The non-display area PA is an area in which an image is not displayed. The display area DA may have a rectangular shape, for example, and the non-display area PA may have a shape surrounding the display area DA. However, the disclosure is not limited thereto, and shapes of the display area DA and the non-display area PA may be relatively designed. It is to be understood that the shapes disclosed herein may also include shapes substantial to the shapes disclosed herein.

The housing HM provides an inner space. The display panel DP is mounted inside the housing HM. In addition to the display panel DP, various electronic components, for example, a power supply unit, a storage device, and an audio input/output module, may be mounted inside of the housing HM.

The display panel DP according to an embodiment will now be described with reference to FIG. 4. Referring to FIG. 4, the substrate (SUB) may include an inorganic insulating material such as glass, or an organic insulating material such as plastic, for example, polyimide (PI). The substrate SUB may be a single layer or a multilayer. The substrate SUB may have a structure in which at least one base layer including a polymer resin sequentially stacked and at least one inorganic layer which may be alternately stacked each other.

The substrate SUB may have various degrees of flexibility. The substrate SUB may be a rigid substrate or a flexible substrate that bends, folds, or rolls, or the like, within the spirit and the scope of the disclosure.

A buffer layer BF may be disposed on the substrate SUB. The buffer layer BF may prevent impurities from being transferred from the substrate SUB to an upper layer of the buffer layer BF, for example a semiconductor layer ACT, thereby preventing deterioration of a characteristic of the semiconductor layer ACT and reducing stress. The buffer layer BF may include an inorganic insulating material such as a silicon nitride or a silicon oxide, or may include an organic insulating material. A portion or an entire portion of the buffer layer BF may be omitted.

The semiconductor layer ACT is disposed on the buffer layer BF. The semiconductor layer ACT may include at least one of polysilicon and an oxide semiconductor. The semiconductor layer ACT may include a channel region C, a first region P, and a second region Q. The first region P and the second region Q are disposed at opposite sides of the channel region C, respectively. The channel region C may be doped with a small amount of impurities or may be a semiconductor that is not doped with impurities, and the first region P and the second region Q may include a semiconductor doped with a large amount of impurities compared to the channel region C. The semiconductor layer ACT may be formed by using an oxide semiconductor, and, a separate protective layer (not illustrated) may be added to protect an oxide semiconductor material that is vulnerable to external environments such as a high temperature.

A first gate insulating layer GI1 may be disposed on the semiconductor layer ACT.

A gate electrode GE and a lower electrode LE are positioned on the first gate insulating layer GI1. According to an embodiment, the gate electrode GE and the lower electrode LE may be integral with each other. The gate electrode GE and the electrode GE may be a single layer or a multilayer in which a metal film including any one of copper (Cu), a copper alloy, aluminum (Al), an aluminum alloy, molybdenum (Mo), a molybdenum alloy, titanium (Ti), and a titanium alloy may be stacked each other. The gate electrode GE may overlap the channel region C of the semiconductor layer ACT.

The second gate insulating layer GI2 may be positioned on the gate electrode GE and the first gate insulating layer GI1. The first gate insulating layer GI1 and the second gate insulating layer GI2 may be a single layer or multiple layers including at least one of a silicon oxide ($SiO_x$), a silicon nitride ($SiN_x$), and a silicon oxynitride ($SiO_xN_y$).

An upper electrode UE may be positioned on the second gate insulating layer GI2. The upper electrode UE may form a storage capacitor while overlapping the lower electrode LE.

A first interlayer insulating layer IL1 is disposed on the upper electrode UE. The first interlayer insulating layer IL1 may be a single layer or multiple layers including at least one of a silicon oxide ($SiO_x$), a silicon nitride ($SiN_x$), and a silicon oxynitride ($SiO_xN_y$).

A source electrode SE and a drain electrode DE are positioned on the first interlayer insulating layer IL1. The source electrode SE and the drain electrode DE are respectively connected to the first region P and the second region Q of the semiconductor layer ACT through contact holes formed in the insulating layers.

The source electrode SE and the drain electrode DE may include aluminum (Al), silver (Ag), magnesium (Mg), gold (Au), nickel (Ni), chromium (Cr), calcium (Ca), molybdenum (Mo), titanium (Ti), tungsten (W), copper (Cu), and/or the like, and may have a single layer structure or a multilayer structure including the material.

A first interlayer insulating layer IL1 and a second interlayer insulating layer IL2 are positioned on the source electrode SE and the drain electrode DE. The second interlayer insulating layer IL2 may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc., within the spirit and the scope of the disclosure.

A first electrode E1 may be disposed on the second interlayer insulating layer IL2. The first electrode E1 may be connected to the drain electrode DE through a contact hole of the second interlayer insulating layer IL2.

The first electrode E1 may include a metal such as silver (Ag), lithium (Li), calcium (Ca), aluminum (Al), magnesium (Mg), and gold (Au), and may also include a transparent conductive oxide (TCO) such as an indium zinc oxide (IZO) and an indium tin oxide (ITO). The first electrode E1 may be formed as a single layer including a metal material or a transparent conductive oxide, or a multiple layer including the same. For example, the first electrode E1 may have a triple layer structure of indium tin oxide (ITO)/silver (Ag)/indium tin oxide (ITO).

A transistor including the gate electrode GE, the semiconductor layer ACT, the source electrode SE, and the drain electrode DE is connected to the first electrode E1 to supply a current to a light emitting element.

A partition wall (or bank) IL3 is positioned on the second interlayer insulating layer IL2 and the first electrode E1. Although not illustrated, a spacer may be positioned on the partition wall IL3. The partition wall IL3 overlaps at least a portion of the first electrode E1, and has a partition wall opening defining an emission area.

The partition IL3 may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc., within the spirit and the scope of the disclosure.

The hole transport region HTR, the emission layer EML, the electron transport region ETR, and the second electrode E2 may be sequentially positioned on the partition wall IL3. The hole transport region HTR, the emission layer EML, the electron transport region ETR, and the second electrode E2 may have the configuration described in FIG. 1, or the hole transport region HTR, the emission layer EML, the electron transport region ETR, and the second electrode E2 may have the configuration described in FIG. 2 or any combination thereof.

The first electrode E1, the hole transport region HTR, the emission layer EML, the electron transport region ETR, and the second electrode E2 may constitute a light-emitting device. Herein, the first electrode E1 may be an anode which is a hole injection electrode, and the second electrode E2 may be a cathode which is an electron injection electrode. However, an embodiment is not limited thereto, and the first electrode E1 may be a cathode and the second electrode E2 may be an anode depending on a driving method of an emissive display device.

An encapsulation layer ENC may be disposed on the second electrode E2. The encapsulation layer ENC may cover or overlap and seal not only the upper surface of the light emitting element but also the side surfaces. Since the light emitting diode is very vulnerable to moisture and oxygen, the encapsulation layer ENC seals the light emitting element to block inflow of moisture and oxygen from the outside.

The encapsulation layer ENC may include layers, and among them, may be formed of a composite film including both an inorganic layer and an organic layer, and for example, may be formed as a triple layer in which a first inorganic encapsulation layer EIL1, an encapsulation organic layer EOL, and a second inorganic encapsulation layer EIL2 are sequentially formed.

The first encapsulation inorganic layer EIL1 may cover or overlap the second electrode E2. The first encapsulation inorganic layer EIL1 may prevent external moisture or oxygen from penetrating into the light emitting element. For example, the first encapsulation inorganic layer EIL1 may include a silicon nitride, a silicon oxide, a silicon oxynitride, or a combination thereof. The first encapsulation inorganic layer EIL1 may be formed through a deposition process.

The encapsulation organic layer EOL may be disposed on the first encapsulation inorganic layer EIL1 to contact the first encapsulation inorganic layer EIL1. Curves formed on an upper surface of the first encapsulation inorganic layer EIL1 or particles present on the first encapsulation inorganic layer EIL1 may be covered or overlapped by the encapsulation organic layer EOL to block an influence of a surface state of the upper surface of the first encapsulation inorganic layer EIL1 on the components formed on the encapsulation organic layer EOL. The encapsulation organic layer EOL may relieve stress between the layers that are in contact therewith. The encapsulation organic layer EOL may include an organic material, and may be formed through a solution process such as spin coating, slit coating, or an inkjet process.

The second encapsulation inorganic layer EIL2 is disposed on the encapsulation organic layer EOL to cover or overlap the encapsulation organic layer EOL. The second encapsulation inorganic layer EIL2 may be stably formed on a relatively flat surface compared to that of the first encapsulation inorganic layer EIL1. The second encapsulation inorganic layer EIL2 encapsulates moisture, for example, emitted from the encapsulation organic layer EOL, to prevent it from being introduced to the outside. The second encapsulation inorganic layer EIL2 may include a silicon nitride, a silicon oxide, a silicon oxynitride, or a combination thereof. The second encapsulation inorganic layer EIL2 may be formed through a deposition process.

Although not illustrated in this specification, a capping layer positioned between the second electrode E2 and the encapsulation layer ENC may be further included. The capping layer may include an organic material. The capping layer protects the second electrode E2 from a subsequent process, for example, a sputtering process, and improves light output efficiency of the light emitting element. The capping layer may have a refractive index that is greater than that of the first encapsulation inorganic layer EIL1.

Figure 5:
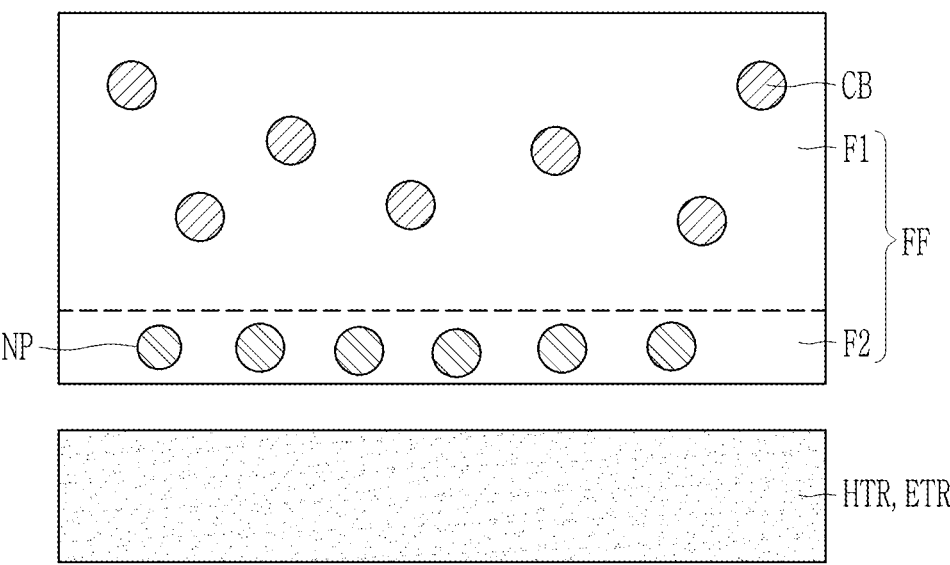
Figure 6:
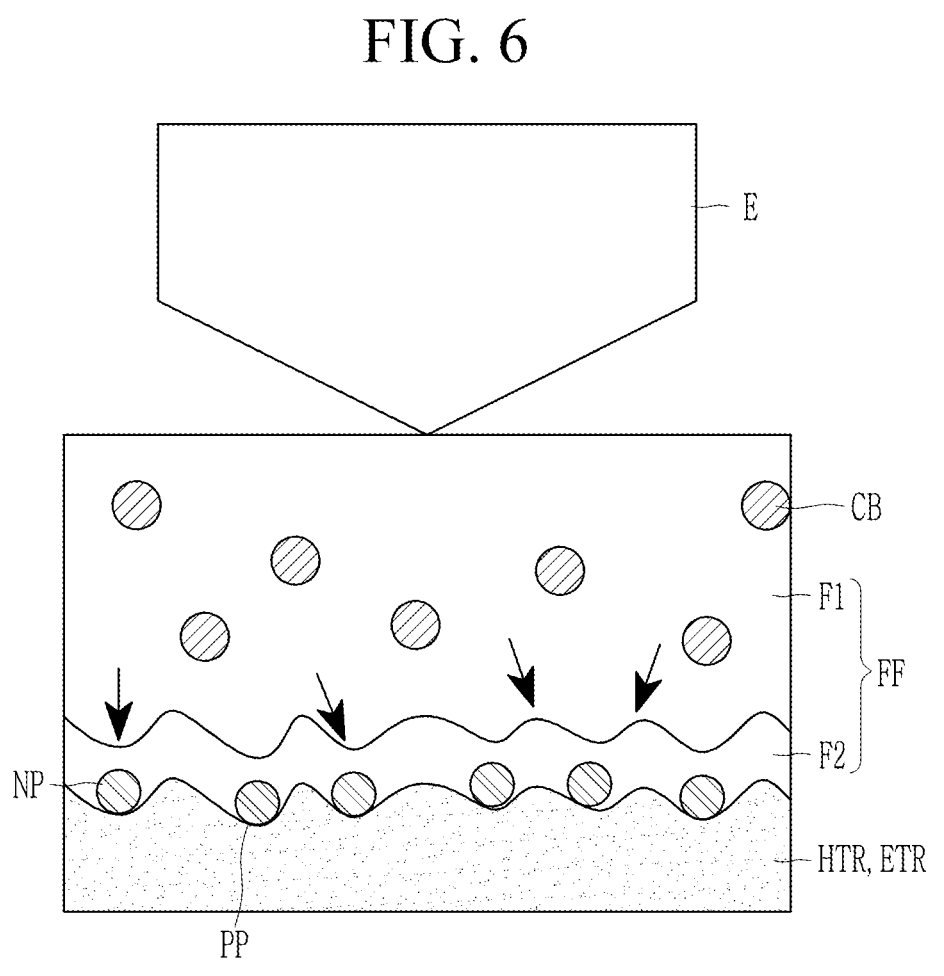
Figure 7:
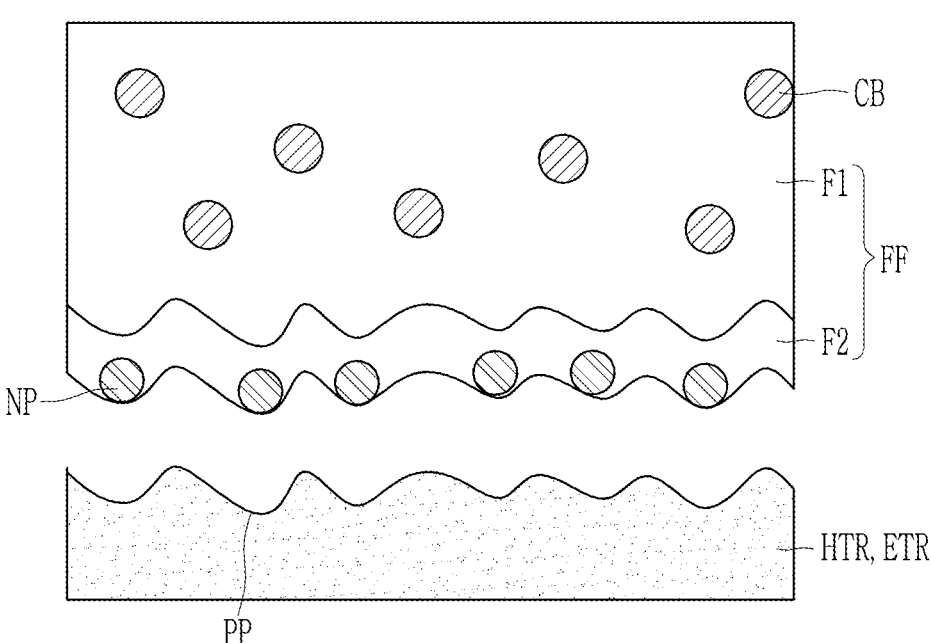

Hereinafter, a manufacturing method of a light-emitting device according to an embodiment will be described with reference to FIG. 5 to FIG. 7. FIG. 5, FIG. 6, and FIG. 7 each illustrate a schematic cross-sectional view showing a manufacturing method of a light-emitting device according to an embodiment.

Referring to FIG. 5, the hole transport region HTR or the electron transport region ETR formed through a deposition process is prepared according to an embodiment. A pressurized film FF including a first layer F1 including carbon black CB, and a second layer F2 formed on a first surface of the first layer F1 to include nanoparticles NP, is prepared. The first layer F1 and the second layer F2 are in a combined state.

The nanoparticles NP according to an embodiment may include a metal or a dielectric material. The metal according to an embodiment may include Au, Ag, Pt, or Pd, and the dielectric material may include glass, ceramic, $SiO_2$, or a material that is similar thereto. However, the nanoparticles NP are not limited to the above-described material, and a material that can pressurize the hole transport region HTR or the electron transport region ETR during expansion of the second layer F2 by thermal energy may be used.

Thereafter, the second layer F2 is disposed to face the hole transport region HTR or the electron transport region ETR, and the second layer F2 is disposed to contact the hole transport region HTR or the electron transport region ETR.

As illustrated in FIG. 6, light energy E is irradiated to the pressurized film FF, for example the first layer F1. The light energy E irradiated to the first layer F1 may be provided through a light source, and the light source may be a high-power flash lamp, an Nd-YAG laser, or the like, within the spirit and the scope of the disclosure. In the case of using the high-power flash lamp, it may be possible to supply the light energy E within a fast process time.

The carbon black CB included in the first layer F1 may absorb light energy E and convert it into thermal energy. The first layer F1 and the second layer F2 coupled or connected to the first layer F1 may expand by the converted thermal energy. The nanoparticles NP included in the expanding second layer F2 may apply pressure to the hole transport region HTR or the electron transport region ETR which are in contact therewith. The hole transport region HTR or the electron transport region ETR may be formed to include the recess portion PP randomly formed by pressing the contacted second layer F2 with a pressure for a time.

Thereafter, as illustrated in FIG. 7, the hole transport region HTR or the electron transport region ETR including the recess portion PP formed on an upper surface thereof may be provided by separating and removing the pressurized film FF. Although the specification has described an embodiment in which the recess portion PP is formed in the hole transport region HTR or the electron transport region ETR, the disclosure is not limited thereto and may be applied to the emission layer EML.

Hereinafter, light-emitting efficiency and lifespan of a light-emitting device according to a comparative example and examples will be described with reference to Table 1.

The comparative example is related to a light-emitting device including no recess portion, Examples 1 to 5 are related to light-emitting devices in which the hole transport region may include a recess portion, and Examples 6 to 10 are related to light emitting devices in which the electron transport region may include a recess portion.

In the case of Examples 1 to 10, it was confirmed that the driving voltage (V), external quantum efficiency (EQE), and the lifespan of the device were mostly improved compared to the comparative example not including the recess portion. Compared to Example 6 to Example 10 in which the electron transport region may include a recess portion, Example 1 to Example 5 in which the hole transport region may include a recess portion has slightly better light-emitting efficiency and lifespan of the device.

TABLE 1

| Division | Driving voltage (V) | Color coordinate (CIEy) | EQE (%) | Lifespan T95 |
|---|---|---|---|---|
| Comparative Example | 4.5 | 0.19 | 20 | 100 |
| Example 1 | 4.6 | 0.19 | 21 | 100 |
| Example 2 | 4.6 | 0.19 | 22 | 118 |
| Example 3 | 4.5 | 0.19 | 23 | 140 |
| Example 4 | 4.6 | 0.19 | 23 | 145 |
| Example 5 | 4.7 | 0.19 | 23 | 145 |
| Example 6 | 4.7 | 0.19 | 21 | 95 |
| Example 7 | 4.6 | 0.19 | 23 | 110 |
| Example 8 | 4.6 | 0.19 | 23 | 115 |
| Example 9 | 4.7 | 0.19 | 23 | 120 |
| Example 10 | 4.7 | 0.19 | 23 | 125 |

According to the above-described embodiments, as the recess portion is randomly positioned on the electron transport region ETR or the hole transport region ETR, some of the light emitted from the light-emitting device may be emitted from the recess portion by total reflection or a waveguide mode. For example, efficiency and lifespan of light emitted from the light-emitting device may be improved. While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A light-emitting device comprising:
a first electrode;
a second electrode that overlaps the first electrode in a plan view;
an emission layer disposed between the first electrode and the second electrode;
a hole transport region disposed between the first electrode and the emission layer, the hole transport region having a planar surface facing the emission layer; and
an electron transport region disposed between the emission layer and the second electrode, wherein
the hole transport region includes a plurality of first recess portions randomly disposed across an entirety of the planar surface facing the emission layer, each first recess portion is recessed into the planar surface, each first recess portion is a depression formed by pressing the planar surface of the hole transport region by external pressure.

2. The light-emitting device of claim 1, wherein the first recess portions have different sizes and shapes.

3. The light-emitting device of claim 1, wherein the electron transport region includes a second recess portion, and the second recess portion is disposed on a side of the hole transport region facing the second electrode.

4. The light-emitting device of claim 3, wherein the electron transport region includes second recess portions, and the second recess portions are randomly disposed.

5. The light-emitting device of claim 4, wherein the second recess portions have different sizes and shapes.

6. A manufacturing method of a light-emitting device, comprising:

forming a hole transport region on a first electrode; and forming an emission layer, an electron transport region, and a second electrode on the hole transport region, sequentially, wherein the forming of the hole transport region includes forming a planar surface facing the emission layer on the hole transport region and forming a plurality of first recess portions randomly disposed across an entirety of the planar surface facing the emission layer, each first recess portion recessed into the planar surface by a pressurized film.

7. The manufacturing method of claim 6, wherein the pressurized film includes:

a first layer including carbon black; and a second layer including nanoparticles and disposed on the first layer.

8. The manufacturing method of claim 7, wherein the forming of the hole transport region includes:

applying light to the pressurized film after bringing the second layer into contact with the hole transport region.

9. The manufacturing method of claim 8, wherein the carbon black converts the light into thermal energy that allows the nanoparticles to press the hole transport region.

10. The manufacturing method of claim 6, wherein the hole transport region is formed by removing the pressurized film.

11. A display device comprising the light-emitting device according to claim 1.

12. The light-emitting device of claim 1, wherein a distance between each of the plurality of first recess portions varies irregularly across the entirety of the planar surface of the hole transport region facing the emission layer.

13. The light-emitting device of claim 1, wherein both the hole transport region and the electron transport region include the recess portion.

* * * * *